United States Patent [19]

Baldi

[11] Patent Number: 4,799,979
[45] Date of Patent: Jan. 24, 1989

[54] HEAT GENERATION

[75] Inventor: Alfonso L. Baldi, Wynnewood, Pa.

[73] Assignee: Alloy Surfaces Company, Inc., Wilmington, Del.

[21] Appl. No.: 830,767

[22] Filed: Feb. 19, 1986

Related U.S. Application Data

[63] Continuation-in-part of Ser. No. 757,606, Jul. 22, 1985, Ser. No. 707,656, Mar. 4, 1985, Ser. No. 685,910, Dec. 27, 1984, Ser. No. 643,782, Jul. 17, 1984, Ser. No. 584,538, Feb. 28, 1984, Ser. No. 559,334, Dec. 8, 1983, abandoned, Ser. No. 538,541, Oct. 3, 1983, Pat. No. 4,694,036, Ser. No. 507,174, Jun. 23, 1983, and Ser. No. 281,405, Jul. 8, 1981, Pat. No. 4,708,913, said Ser. No. 707,656, Ser. No. 685,910, Ser. No. 643,782, Ser. No. 584,538, and Ser. No. 559,334, each is a continuation-in-part of Ser. No. 554,441, Nov. 22, 1983, abandoned, said Ser. No. 685,910, Ser. No. 643,782, Ser. No. 584,538, Ser. No. 559,334, Ser. No. 538,541, and Ser. No. 554,441, each is a continuation-in-part of Ser. No. 531,444, Sep. 12, 1983, abandoned, said Ser. No. 507,174, is a continuation-in-part of Ser. No. 299,789, Sep. 4, 1981, abandoned.

[51] Int. Cl.$^4$ ............................................. C06B 45/30
[52] U.S. Cl. ................................. 149/5; 149/2; 149/108.6; 428/182; 428/288; 428/408; 102/505
[58] Field of Search .................... 149/2, 5, 108.6; 428/182, 408, 288; 102/505

[56] References Cited

U.S. PATENT DOCUMENTS 4,292,208  9/1981  Baldi et al. .......................... 428/680

Primary Examiner—Stephen J. Lechert, Jr.
Attorney, Agent, or Firm—Connolly and Hutz

[57] ABSTRACT

Heating or heat generation in general can be from activated aluminides of molybdenum, zirconium or other similar ignitible metals. Activation is by leaching out some of the aluminum and leaves a product which is highly pyrotechnic but not pyrophoric. Activation of such alloy renders activated surface porous so it can receive impregnants such as lubricants to thus act as a bearing. Pyrotechnic webs for use as decoys against heat-seeking missiles can be folded so that portions interfere with the free radiation of other portions, to thus extend the time the webs remain at high temperature. The folding also improves the trajectory through which the webs fall when discharged into the air. The web can be coated with a thin layer of powdered silica, alumina or zirconia to increase the proportion of its radiation in the 8 to 14 micron range.

6 Claims, No Drawings

HEAT GENERATION

This application is in part a continuation of applications:

| Ser. No. | Filing Date |
|---|---|
| 757,606 | July 22, 1985 |
| 707,656 | March 4, 1985 |
| 685,910 | December 27, 1984 |
| 643,782 | July 17, 1984 |
| 584,538 | February 28, 1984 |
| 559,334 | December 8, 1983 (subsequently abandoned) |
| 538,541 | October 3, 1983 (Pat. No. 4,694,036 granted Sep. 15, 1987) |
| 507,174 | July 8, 1981 (Pat. No. 4,708,913 granted Nov. 24, 1987) |
| 281,405 | | of which '656, '910, '782, '538 and '334 are continuations-in-part of applicaton Ser. No. 554,441 filed Nov. 22, 1983 and subsequently abandoned; while '910, '782, '538, '334, '541 and '441 are continuations-in-part of application Ser. No. 531,444 filed Sept. 12, 1983 and subsequently abandoned; and '174 is a continuation-in-part of application Ser. No. 299,789 filed Sept. 4, 1981 and subsequently abandoned.

The objects of the present invention include the provision of novel heat-generating materials.

The foregoing, as well as still further objects of the present invention, will be more fully understood from the following description of several of its exemplifications, reference being made to the accompanying drawings in which:

According to one aspect of the present invention, there are provided highly active heat-generating compositions which burn in air when heated, but are essentially inert at temperatures below about 50° C. to 100° C. so they can be conveniently stored for use when desired.

As shown in the parent applications, aluminides such as $FeAl_3$ and $NiAl_3$ become pyrophoric after some of their aluminum is leached out as by aqueous caustic soda or caustic potash. Moreover, their pyrophoric behavior is intensified when a relatively small amount of boron is alloyed with the aluminide.

Although the foregoing pyrophoric materials can be stabilized by subjecting them to a very small quantity of oxygen in a manner that does not permit them to appreciably heat up, the resulting stability tends to break down at about 50° C. or a little higher.

The leaching of the present invention can also be effected with inhibited hydrochloric acid such as that referred to supra, but the resulting activation is not as great as produced by caustic leaches.

There can also be included in the foregoing alloys ingredients that improve the pyrotechnic behavior. Thus, about 2% to 20% of boron or magnesium or iron or mixtures of these, are helpful in this respect, and can be added to a melt or to a diffusion-alloying mixture. Also, these metals can be introduced by diffusion into a pre-formed aluminide or by diffusion with the aluminum. For example, 250 grams of powdered $ZrAl_4$ can be mixed with 10 grams of powdered boron and 5 grams of sodium fluoborate, and subjected to a diffusion heat as described in U.S. Pat. No. 3,801,357, but without using inert solid diluent, for three hours at 1800° F. in an argon-bathed atmosphere.

About 1% to about 10% of iron can be similarly introduced into the aluminide with or without the boron, to provide activatable alloys that after activation ignite at temperatures of about 300° C. or a little lower. Magnesium-aluminum alloys can also be activated by the foregoing techniques to provide activated material having ignition temperatures below 300° C. The magnesium-aluminum alloys preferably have, before activation, at least two atoms of aluminum for every atom of magnesium, but can be activated even when the aluminum-magnesium atom proportion is as low as 1½:1. The aluminum-to-zirconium atom ratio is preferably at least 4:1 but can be as low as 2:1.

Including 2% to 20% boron in the magnesium-aluminum or zirconium-aluminum alloys, based on the weight of the magnesium or zirconium, also increases their pyrotechnic output.

The foregoing pyrotechnic improvements are also obtained with alloys in the form of foils and sheets, as well as powders.

The boron additions of the present invention can also be effected by the procedures described in U.S. Pat. No. 4,536,215.

The foregoing low-ignition-point activated alloys are readily ignited with an ordinary household match.

Diffusion aluminizing without leaching can be used to form protective coatings on jet engine titanium components, for example, as shown in Ser. No. 707,656. Such titanium components can also be provided with protective coatings by diffusing in boron, carbon or nitrogen. The boron diffusion can be conducted just like the aluminum diffusion, by substituting powdered boron for the powdered aluminum, using a 700° C. diffusion temperature for fourteen hours, with 1% $NaBF_4$ as the energizer.

Carbonizing and nitriding of the titanium components can be effected in carbonizing atmospheres or nitriding solutions, as used for carbonizing or nitriding steel. These techniques are described in U.S. Pat. Nos. 3,787,223 and 3,787,245.

The aluminizing and leaching sequence of the present invention is also effective to provide on a substrate a porous surface which is suitable for use as a bearing surface when impregnated with a liquid or solid bearing lubricant. For example, a cylindrical bearing shell of one mm thick nickel is aluminized at 400° C. to 500° C. for sufficient time to form an aluminized diffusion case about 1/20 mm thick. The aluminized nickel is then given a caustic soda leaching treatment as described above to leave a very porous surface. That surface is then connected as cathode in an electroplating bath to deposit lead, tin, copper, or other bearing metal, building up the electroplated layer to about 1/15 mm above the surface of the leached substrate.

Electroless metal plating can also be used if desired, and is actually more effective in depositing metal deep within the pores of the porous surface. Suitable electroless copper plating baths are disclosed in U.S. Pat. Nos. 4,563,217 and 2,938,805, as well as on pages 77 and 78 of Plating Methods published 1972 by NASA (NASA SP-5114), where Versene-T refers to the sodium salt of ethylenediaminetetraacetic acid. The leached substrate surface can be pyrophorically de-activated before the electroplating or electroless plating, using the $H_2O_2$ and water treatments of U.S. Pat. No. 4,443,557, or exposing the activated surface to low pressure oxygen—such as 0.05 bar.

Liquid or grease bearing lubricants can be used in addition to or in place of metal impregnants.

The porous substrate surface contains an appreciable proportion of alloyed aluminum which imparts a hardening effect. After impregnation with a bearing lubricant it makes a very good bearing surface that withstands the effects of foreign infiltrations such as sand in a sandy environment.

The heat generation from a pyrotechnic article is generally of relatively short duration. Thus, an iron foil 0.05 millimeter thick, after pyrophoric activation on both faces and cutting to a square 4.5 centimeters on edge, will on exposure to air with both the foil and air at room temperature, rapidly get hot enough to reach about 1280° F. and then cool down to about 350° F. in about twelve seconds.

The time dwell can be increased over 60%, by bending the foil so portions interfere with the open radiation of other portions. By way of example when the above-activated foil, before exposure to air is run through a corrugator which forms seven equally spaced corrugations each about 4 millimeters deep and then exposed and its radiation output measured the same way as the flat foil was measured, shows a maximum temperature of about 1310° F., and takes about 29 seconds to cool down to 350° F. FIG. 2 illustrates such a corrugated web. About 2 to about 4 corrugations per centimeter, each about 3 to about 6 millimeters deep, are preferred.

A similar or even greater increase in dwell is obtained by accordion-folding the activated flat foil to provide three equal-width folds joined by sharp creases in the foil. The dwell is greater when the folds are folded together to form a generally flattened accordion, as compared to pulling the accordion folds apart so the resulting foil is very much like a corrugated foil. The natural springiness of the foil can cause the folds to open a little, after the folds are made.

The inrease in high temperature dwell can be as much as about 200%, and is very helpful when the activated foil is used as a decoy for heat-seeking missiles. For such use it is desirable to have a dwell of at least about 15 seconds and preferably at least about 30 seconds. Dwells of that magnitude and more are readily obtained from a relatively tightly folded 4-fold accordion folded foil, or from a foil currugated to a depth of at least six millimeters with at least four corrugations per centimeter.

A feature of the corrugated and accordion-folded foils is that they nest very effectively so a large number of them can be packed into a small container such as a decoy shell that ruptures and ejects a cloud of decoy foils. The accordion fold embodiments nest with maximum packing density when they are folded flat, but they can alternatively be nested when pulled out so the nesting is like that of the corrugated embodiments. When nested flat, the accordion folds are preferably made with some springiness as noted above, so they will open a little when a nested pack is ejected into the air. such springiness is readily provided by making the folds with minimum folding force.

Iron foils are very inexpensive starting materials from which to make the decoys, and they can be activated on one or both of their surfaces. The degree of activation is such that the foil thickness after activation is about 2 to 3 times its thickness before activation. When starting with an unactivated foil about 1½ to about 3 mils thick, the activated and corrugated or accordion-folded foil will when ejected in masses of about 1000 or more each about 2 to about 5 centimeters long and about 1 to about 3 centimeters wide, fall through the air in a trajectory that is very effective for decoy use. Such trajectory is steeper at altitudes of 8 kilometers than at sea level, but is suitable at both altitudes as well as at intervening altitudes.

Instead of iron foils other types of pyrophoric or pyrotechnic webs can be used. Nickel foil works about the same way as iron foils but generally shows a somewhat steeper temperature rise and shorter heat-generating dwell along with a higher temperature peak. Woven carbon fiber cloth has a lower density than metal and for use as a missile decoy is preferably about ¼ to about ¾ millimeters thick. Such cloths can be impregnated with pyrophoric powder in sufficient quantity so that when the impregnated cloth is exposed to the air, the pyrophoric powder ignites spontaneously and then ignites the cloth.

Alternatively, the carbon fiber cloth can be ignited with a pyrophoric liquid aluminum alkyl, as for example, by packing a quantity of the cloths inside a discharging shell along the tri-ethyl aluminum.

As shown in the parent applications, the carbon cloth is made easier to ignite as by etching its surface and/or coating the surface with lead or copper acetate deposited from aqueous solution. However, it can be ignited even when not pre-treated.

The carbon cloths can be folded in the manner described above for the metal foil to increase the dwell of their heat output. To retain the folds in the carbon cloth, the cloth can be impregnated with a stiffening resin, like polyethylene terephthalate or polyvinylacetate or polymethylmethylacrylate. Alternatively, the carbon fiber can be woven with stiff metal wires or can be woven through a stiff metal screen.

The radiation effectiveness of any of the pyrotechnic webs for decoy use can be substantially improved by adherently coating their surfaces with a layer about 20 to about 500 microns thick of finely divided alumina, silica or zirconia, or mixtures of any two or all three in any proportions. Thus, a 0.4 millimeter-thick web of woven carbon fiber cloth pre-treated with 0.2 molar lead acetate and impregnated with 1% to 10% activated iron powder, is immersed into a 2.5% by weight solution of poly (ethyl acrylate) resin in methylethylketone, then the impregnated cloth is withdrawn from the resin solution, dried for a few seconds and dropped into a container having a quantity of 325-mesh zirconia. The container is shaken in order to get the zirconia particles spread over the cloth, after which the coated cloth is removed and dried. When the dried product is exposed to air, the particles of activated iron ignite and ignite the carbon which then burns and the incandescence thus produced has a high concentration of radiation in the 8-to-14-micron wave length of the spectrum. A somewhat better concentration is obtained when half the zirconia is replaced by alumina.

Silica and/or silicon carbide particles can be used in place of or in mixtures with the zirconia and/or alumina.

The particles can be applied to the carbon cloth web by spraying on it a slurry of the particles in the resin solution. It is preferred that the slurry contain a high concentration of the particles, about 10 to 50 times the weight of the resin.

A preferred technique is to take a flat carbon fiber cloth about 0.5 millimeter thick and pre-dipped as noted above in aqueous lead acetate and then dried, coat one of its faces with a spray of 90 parts by weight of a 1:1 mixture of 325-mesh $ZrO_2$ slurried in 100 parts by weight of a 2 weight percent solution of poly (methylmethacrylate) in acetone. The coating is built up to a thickness of about ½ millimeter, and then permitted to dry. On the opposite face of the cloth there is sprayed on, in an argon atmosphere, about a 70 micron-thick slurry of activated iron powder particles about 10 microns in size, in twice its weight of a 3 weight percent solution of poly (ehtyl acrylate) in acetone. This coating can be as much as 300 microns in thickness.

The second coating is dried in the argon atmosphere and still in that atmosphere is given a top coating of the $ZrO_2$-$Al_2O_3$-binder slurry, about ⅓ the thickness of the original $ZrO_2$-$Al_2O_3$-binder coating, and again the coated cloth is dried in the argon atmosphere. One or more of such coated cloths can be sealed in a plastic bag or decoy shell and will keep until needed for decoy use. At that time, the cloths are exposed to air and will spontaneously ignite. They show a very good thermal radiation in the 8-to-14 micron band. The face carrying the thicker $ZrO_2$-$Al_2O_3$-binder coat shows stronger radiation in that band than the face carrying the thinner such coat.

Solutions of other tacky resins such as other acrylic resins, polyvinylacetate, polyurethanes and pressure-sensitive resin formulations can be used in place of the noted poly acrylates. Suspensions of resins in liquids in which they do not dissolve are not particularly effective.

Where an aluminum alkyl is used for ignition in place of the activated iron, the adhesive resin should not be one in which the alkyl dissolves.

Activated iron or nickel particles, when used, can be applied to the carbon cloth by the techniques described for the zirconia, or the resin-to-activated-powder ratio can be diminished and even reduced to zero. Thus, a resin-free slurry of very finely divided activated powder in water can be sprayed onto one or both faces of the carbon cloth to deposit about 1/50 to about 1/10 gram of the activated powder per square centimeter of cloth surface. After a little drying in argon, there is then sprayed over both faces of the particle-carrying cloth, a slurry of zirconia powder. The binder in the zirconia slurry then holds the activated powder particles in place, and such a coating not over about 100 microns thick does not prevent their pyrophoric reaction when the coated cloth is exposed to air.

The pyrophoric metal foils of the present invention are preferably prepared in large quantities by the use of the open-coil activating technique described in U.S. Pat. No. 4,443,557. A number of individual activating retorts can thus be loaded with an open coil of iron foil, and with the mixture of 20% powdered aluminum and 80% powdered alumina, along with about ½% to about 1% of $AlCl_3$ or $CrCl_3$ activator. The individual retorts so loaded are moved through a furnace as described in connection with FIG. 4 of U.S. Pat. No. 3,903,338, so the contents of each retort reach about 1200° F. for about ½ to about 1 hour. Better results are obtained at lower temperatures and longer times, as for example, 900° F. for 16 hours.

After cooling, the aluminized foil is reacted with aqueous caustic containing dissolved tin as described in the parent applications to leach out some of the aluminum which had diffused into the foil.

Alternatively, the foil can be activated by continuous reeling of a long length through a retort as shown in U.S. Pat. No. 4,435,481. As there described, the activation can be effected on one or both faces of the foil. The mixture of powdered alumium and powdered alumina should have at least 40% alumina by weight, inasmuch as smaller proportions of alumina will permit some of the powdered aluminum, which melts during the treatment, to wet the foil. This is undesirable inasmuch as it blocks the activated diffusion of the aluminum into the iron. Such activated diffusion brings much more desirable results than diffusion from a melt coating.

The activated metal foils can also be coated with a binder-containing slurry of the $ZrO_2$, $Al_2O_3$ or other material that concentrates pyrophoric radiation in the 8-to-14 micron range. Again, the slurry should contain solid particles in an amount from about 10 to about 50 times the weight of the binder, and the coating should not be over about 100 microns thick on at least one face of the foil.

Many modifications and variations of the present invention are possible in the light of the above teachings. It is, therefore, to be understood that within the scope of the appended claims the invention may be practiced otherwise than as specifically described.

I claim:

1. A heat-generating pyrotechnic article in the form of a carbon fiber web hot over about one millimeter thick, bent to provide portions that block the open radiation of heat from other portions sufficiently to increase the heat-generating time at least about 60% as compared to when the web is not bent.

2. The article of claim 1 in which the web carries pyrophoric metal in a quantity sufficient to pyrophorically ignite when exposed to air, and to then ignite the carbon fiber.

3. A heat-generating pyrotechnic article in the form of a web not over about one millimeter thick, the web having cemented to its surface a porous layer about 20 to about 500 microns thick of finely divided silica, alumina or zirconia or mixtures of them.

4. The article of claim 3 in which the web is a carbon fiber cloth that also carries pyrophoric powder.

5. In the process of discharging carbon fiber web to decoy heat-seeking objects, the improvement according to which the web is the web of claim 1.

6. In the process of discharging carbon fiber web to decoy heat-seeking objects, the improvement according to which the web is the web of claim 2.

* * * * *

UNITED STATES PATENT AND TRADEMARK OFFICE
CERTIFICATE OF CORRECTION

PATENT NO. : 4,799,979

DATED : January 24, 1989

INVENTOR(S) : Alfonso L. Baldi

It is certified that error appears in the above-identified patent and that said Letters Patent is hereby corrected as shown below:

In item [63] on the title page, lines 5 and 6, "Pat. No. 4,694,036" should be deleted.

Column 1, the "(subsequently abandoned)" entries applied against Ser. No. 281,405 should be deleted.

Column 1, line 15 after "507,174 June 23, 1983" insert --Pat No. 4,694,036 granted September 15, 1987--

Column 1, between lines 34 and 35 insert -- The Figure is a sectional view of a thermal radiator according to the present invention--.

Column 3, line 38, "increase" is misspelled.

Column 3, line 59, "such" should be --Such--.

Column 4, line 22, change "the" to --with--.

Column 5, line 2, before "slurried", insert -- and $Al_2O_3$ --

Column 5, line 10, "ethyl" is misspelled.

Claim 1, line 2, change "hot" to --not--.

Signed and Sealed this

Fourth Day of September, 1990

Attest:

HARRY F. MANBECK, JR.

*Attesting Officer*     *Commissioner of Patents and Trademarks*